United States Patent
Sharma et al.

(10) Patent No.: US 9,841,945 B2
(45) Date of Patent: Dec. 12, 2017

(54) EFFICIENT CONSTANT MULTIPLIER IMPLEMENTATION FOR PROGRAMMABLE LOGIC DEVICES

(71) Applicant: Lattice Semiconductor Corporation, Hillsboro, OR (US)

(72) Inventors: Sunil Kumar Sharma, Fremont, CA (US); Mohana Tandyala, Fremont, CA (US)

(73) Assignee: LATTICE SEMICONDUCTOR CORPORATION, Hillsboro, OR (US)

( * ) Notice: Subject to any disclaimer, the term of this patent is extended or adjusted under 35 U.S.C. 154(b) by 302 days.

(21) Appl. No.: 14/316,049

(22) Filed: Jun. 26, 2014

(65) Prior Publication Data

US 2015/0378682 A1 Dec. 31, 2015

(51) Int. Cl.
| | |
|---|---|
| G06F 7/52 | (2006.01) |
| G06F 5/01 | (2006.01) |
| H03K 19/177 | (2006.01) |
| G06F 17/50 | (2006.01) |
| G06F 7/527 | (2006.01) |

(52) U.S. Cl.
CPC ............ G06F 5/01 (2013.01); G06F 17/5054 (2013.01); H03K 19/17732 (2013.01); *G06F 7/527* (2013.01)

(58) Field of Classification Search
CPC .............................. G06F 7/44; G06F 17/5054
See application file for complete search history.

(56) References Cited

U.S. PATENT DOCUMENTS 5,600,569 A * 2/1997 Nishiyama ................ G06F 7/52
708/625

FOREIGN PATENT DOCUMENTS

JP 06-301741 * 10/1994 ............. G06F 15/60

OTHER PUBLICATIONS

Alon, Elad, Digital Logic and FPGA Introduction, Aug. 30, 2011, University of California Berkeley, Slides 1-47.*
Parihar, Raj et al, Efficient Floating Point 32-Bit Single Precision Multipliers Design Using VHDL, May 2005, BIRLA Institute of Technology and Science, pp. 1-67.*
Wikipedia, Arithmetic Shift, Mar. 8, 2013, pp. 1-4.*

* cited by examiner

*Primary Examiner* — David H Malzahn
(74) *Attorney, Agent, or Firm* — Haynes and Boone, LLP

(57) ABSTRACT

Various techniques are provided to efficiently implement user designs in programmable logic devices (PLDs). In one example, a computer-implemented method includes receiving a design identifying operations to be performed by a PLD and synthesizing the design into a plurality of PLD components. The synthesizing includes detecting a constant multiplier operation in the design, determining a nearest boundary condition for the constant multiplier operation, and decomposing the constant multiplier operation using the nearest boundary condition to reduce the plurality of PLD components. The reduced plurality of PLD components comprise at least one look up table (LUT) configured to implement an addition or subtraction operation of the decomposed constant multiplier operation.

20 Claims, 5 Drawing Sheets

EFFICIENT CONSTANT MULTIPLIER IMPLEMENTATION FOR PROGRAMMABLE LOGIC DEVICES

TECHNICAL FIELD

The present invention relates generally to programmable logic devices and, more particularly, to the synthesis of user designs implemented in such devices.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, the user designs are synthesized and mapped into configurable resources (e.g., programmable logic gates, look-up tables (LUTs), embedded hardware, or other types of resources) and interconnections available in particular PLDs. Physical placement and routing for the synthesized and mapped user designs may then be determined to generate configuration data for the particular PLDs.

User designs sometimes include one or more arithmetic operations where a variable is multiplied by a constant. Conventional methods for synthesizing and/or mapping constant multiplier operations into configurable resources in a PLD can lead to an increased propagation delay, which in turn results in an increased clock period and reduced clock frequency for the PLD. Moreover, such conventional methods may also inefficiently allocate configurable resources and interconnections.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
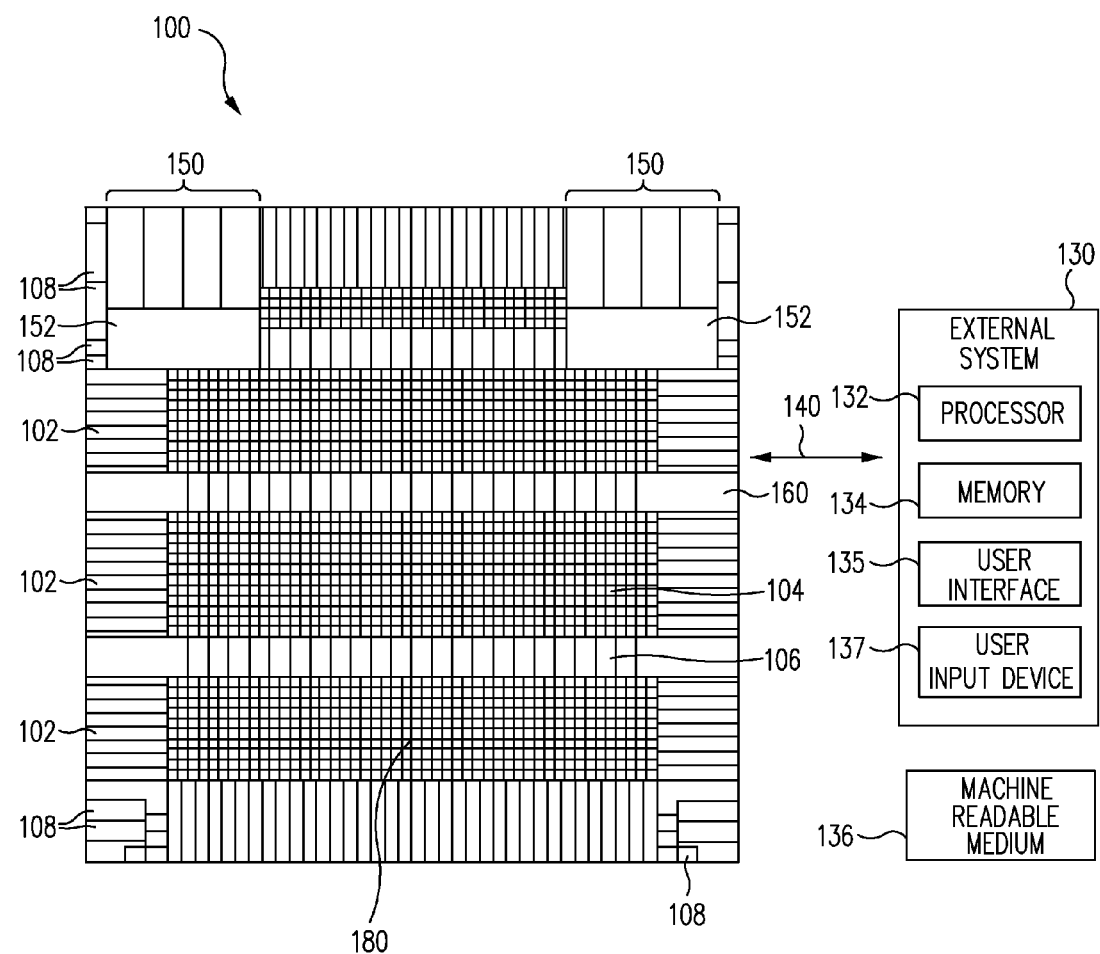
FIG. 1 illustrates a block diagram of a programmable logic device (PLD) in accordance with an embodiment of the disclosure.

In accordance with embodiments set forth herein, techniques are provided to efficiently implement user designs in programmable logic devices (PLDs). In various embodiments, a user design may be converted into and/or represented by a set of PLD components (e.g., configured for logic, arithmetic, or other hardware functions) and their associated interconnections available in a PLD. In various embodiments, a constant multiplier (e.g., multiplication) operation synthesis and/or mapping process (e.g., also referred to as an optimization process) may be performed on the user design to reduce propagation delays and/or consumption of PLD resources and interconnections. In some embodiments, the various techniques described herein may be applied to PLDs in the iCE40 family devices available from Lattice Semiconductor Corporation, or other devices as appropriate.

In some embodiments, such a process includes identifying one or more constant multiplier operations within a user design which, when a PLD is configured to implement the user design, could be implemented relatively efficiently using the methods described herein. To explain, a constant multiplier operation may be represented generically by the relation $A*C=P$, where A is the variable input, C is the constant of the operation, and P is the output of the operation (e.g., the product of A and C). In some embodiments, a PLD may not include dedicated multiplier blocks that can be assigned to a constant multiplier operation, or a user design may include more multiplier operations than available dedicated multiplier blocks, and so at least one constant multiplier operation will be decomposed into constituent operations (e.g., one or more addition, subtraction, shift, and/or other logic or arithmetic operations) that can be implemented using available resources of the PLD. In such embodiments, the process may include determining various decompositions of the constant multiplier operation so as to allow selection of a relatively efficient implementation.

To illustrate, in the context of binary arithmetic, $A*4=P$ may be decomposed using at least two different decompositions: (1) two bitwise shift operations and a single addition operation (e.g., $\{A,0\}+\{A,0\}=P$, where $\{A,0\}$ represents shifting variable A to the left by a single null binary digit); and (2) a single bitwise shift operation (e.g., $\{A,00\}=P$, where $\{A,00\}$ represents shifting variable A to the left by a two null binary digits). Both decompositions (1) and (2) output the same result P, but decomposition (2) requires fewer PLD resources and a shorter propagation delay due to the lack of the addition operation. The number of available decompositions can increase dramatically with the value of the constant, and so the complexity in determining an efficient decomposition can easily become resource limited when attempting to implement a full user design (e.g., comprising many hundreds or thousands of different operations) in a PLD. Thus, a generally applicable method to determine a relatively efficient decomposition without analyzing all possible decompositions, as described herein, offers substantial benefit both in terms of design synthesis time and resulting PLD resource (area and time delay) allocation.

In one embodiment, such a method may include determining a nearest boundary condition for the constant multiplier operation, where the nearest boundary condition corresponds to a relatively efficient arithmetic and/or logic decomposition associated with the particular type of multiplier operation and/or PLD. For example, in the most general sense as used herein, the term "boundary conditions" may be defined as a selection of constant multiplier operations, disposed along a continuum of all possible constant multiplier operations, having decompositions that can be implemented relatively efficiently in a particular PLD. The selection of efficient constant multiplier operations may be differentiated from the continuum by their constants, for example, and the specific selection may be a function of the type and/or ordering of constant multiplier operations being implemented, for example, and may additionally (or alternatively) be a function of the type, number, arrangement, and/or other characteristics of the PLD components available to implement the constant multiplier operation.

The "nearest" boundary condition for a generic or test constant multiplier operation is the constant multiplier operation, among the selection of efficient constant multiplier operations, that may be used to implement the generic constant multiplier operation with the least amount of additional PLD resources (e.g., PLD components and/or delay time, in addition to that associated with implementing the nearest boundary condition), as described herein. In cases where the generic constant multiplier operation is equidistant from two boundary conditions, there is no defined "nearest" boundary condition, and such cases may be decomposed using additional methodologies described herein. The case where the generic constant multiplier operation is a member of the selection of efficient constant multiplier operations may, in some embodiments, be treated as a special case where the generic constant multiplier operation is embedded into a subsequent or prior arithmetic operation rather than decomposed into constituent operations using the methods described herein.

In the case where the constant multiplier operation is to be implemented as a binary multiplier operation on a binary-based PLD, the nearest binary boundary condition may correspond to a nearest power of two for the constant of the constant multiplier operation. For example, binary multiplication of any power of two may be decomposed very efficiently into a single shift operation (e.g., $A*2^n=\{A, 0_1 \ldots 0_n\}$, where n is a whole number, and where $\{A, 0_1 \ldots 0_n\}$ represents shifting variable A to the left by "n" null binary digits). Thus, to take advantage of the efficient power of two decomposition (e.g., available for binary operations on binary PLD implementations), a binary multiplication of a constant may be decomposed into a shift operation corresponding to the power of two nearest the constant and one or more addition and/or subtraction operations corresponding to any remainder. This concept may be extended to any boundary condition corresponding to a particular arithmetic and/or logical base for the constant multiplier operation and/or the corresponding PLD. For example, in some embodiments, the nearest boundary condition may correspond to a ternary, quaternary, octal, decimal, hexadecimal, and/or other arithmetic and/or logical base multiplier operation and/or PLD implementation and a relatively efficient multiplication decomposition corresponding to that base.

In cases where the constant is disposed equidistant between boundary conditions, there is no defined nearest boundary condition (e.g., there is no single nearest boundary condition), and the method may include selecting one or the other corresponding decomposition and/or another type of arithmetic and/or logical decomposition. When a nearest boundary condition exists, however, the number and stages (e.g., also referred to as "levels" where the output of one operation is fed into the input of another operation to produce a result) of the one or more addition and/or subtraction operations used to compensate for the remainder will typically be less than the number and stages of similar operations used in conventional decompositions. For example, shift operations, as described herein, may be implemented to be performed substantially in parallel with a linked addition and/or subtraction operation, and increasing the number of bits shifted does not by itself increase the number of stages or the time delays associated with the shift operation. Once a decomposition is determined and/or selected, that decomposition may be used to synthesize and/or map the constant multiplier operation into a corresponding reduced number of PLD components and/or an arrangement of PLD components with a reduced propagation delay.

As a result of such process (e.g., optimization), a constant multiplier operation with a corresponding nearest boundary condition can be implemented relatively efficiently using a shift operation and one or more addition or subtraction operations, thereby freeing up the configurable PLD components that would otherwise be occupied by additional arithmetic and/or logical operations. In addition, the efficient decomposition can be determined without requiring full analysis of all possible decompositions of the constant multiplier operation. Furthermore, because the number of stages of operations used in the decomposition will be reduced, the propagation delay of the constant multiplier operation will also be reduced, which in some cases may advantageously permit an increase in the clock frequency of a PLD configured with the user design.

In some embodiments, the converted user design and/or the optimized user design may be represented by a netlist that identifies various types of components provided by the PLD and their associated signals. In embodiments that produce a netlist of the converted user design, the optimization process may be performed on such a netlist.

Referring now to the drawings, FIG. 1 illustrates a block diagram of a PLD 100 in accordance with an embodiment of the disclosure. PLD 100 (e.g., a field programmable gate array (FPGA)), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)).

I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100. Additional I/O functionality may be provided by serializer/deserializer (SERDES) blocks 150 and physical coding sublayer (PCS) blocks 152. PLD 100 may also include hard intellectual property core (IP) blocks 160 to provide additional functionality (e.g., substantially predetermined functionality provided in hardware which may be configured with less programming than logic blocks 104).

PLD 100 may also include blocks of memory 106 (e.g., blocks of EEPROM, block SRAM, and/or flash memory), clock-related circuitry 108 (e.g., clock sources, PLL circuits, and/or DLL circuits), and/or various routing resources 180 (e.g., interconnect and appropriate switching logic to provide paths for routing signals throughout PLD 100, such as for clock signals, data signals, or others) as appropriate. In general, the various elements of PLD 100 may be used to perform their intended functions for desired applications, as would be understood by one skilled in the art.

For example, certain I/O blocks 102 may be used for programming memory 106 or transferring information (e.g., various types of user data and/or control signals) to/from PLD 100. Other I/O blocks 102 include a first programming port (which may represent a central processing unit (CPU) port, a peripheral data port, an SPI interface, and/or a sysCONFIG programming port) and/or a second programming port such as a joint test action group (STAG) port (e.g., by employing standards such as Institute of Electrical and Electronics Engineers (IEEE) 1149.1 or 1532 standards). In various embodiments, I/O blocks 102 may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or logic blocks 104 as appropriate.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout PLD 100, such as in and between logic blocks 104, hard IP blocks 160, and routing resources 180 to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

An external system 130 may be used to create a desired user configuration or design of PLD 100 and generate corresponding configuration data to program (e.g., configure) PLD 100. For example, system 130 may provide such configuration data to one or more I/O blocks 102, SERDES blocks 150, and/or other portions of PLD 100. As a result, programmable logic blocks 104, routing resources 180, and any other appropriate components of PLD 100 may be configured to operate in accordance with user-specified applications.

In the illustrated embodiment, system 130 is implemented as a computer system. In this regard, system 130 includes, for example, one or more processors 132 which may be configured to execute instructions, such as software instructions, provided in one or more memories 134 and/or stored in non-transitory form in one or more non-transitory machine readable mediums 136 (e.g., which may be internal or external to system 130). For example, in some embodiments, system 130 may run PLD configuration software, such as Lattice Diamond System Planner software available from Lattice Semiconductor Corporation to permit a user to create a desired configuration and generate corresponding configuration data to program PLD 100.

System 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of PLD 100.

Figure 2:
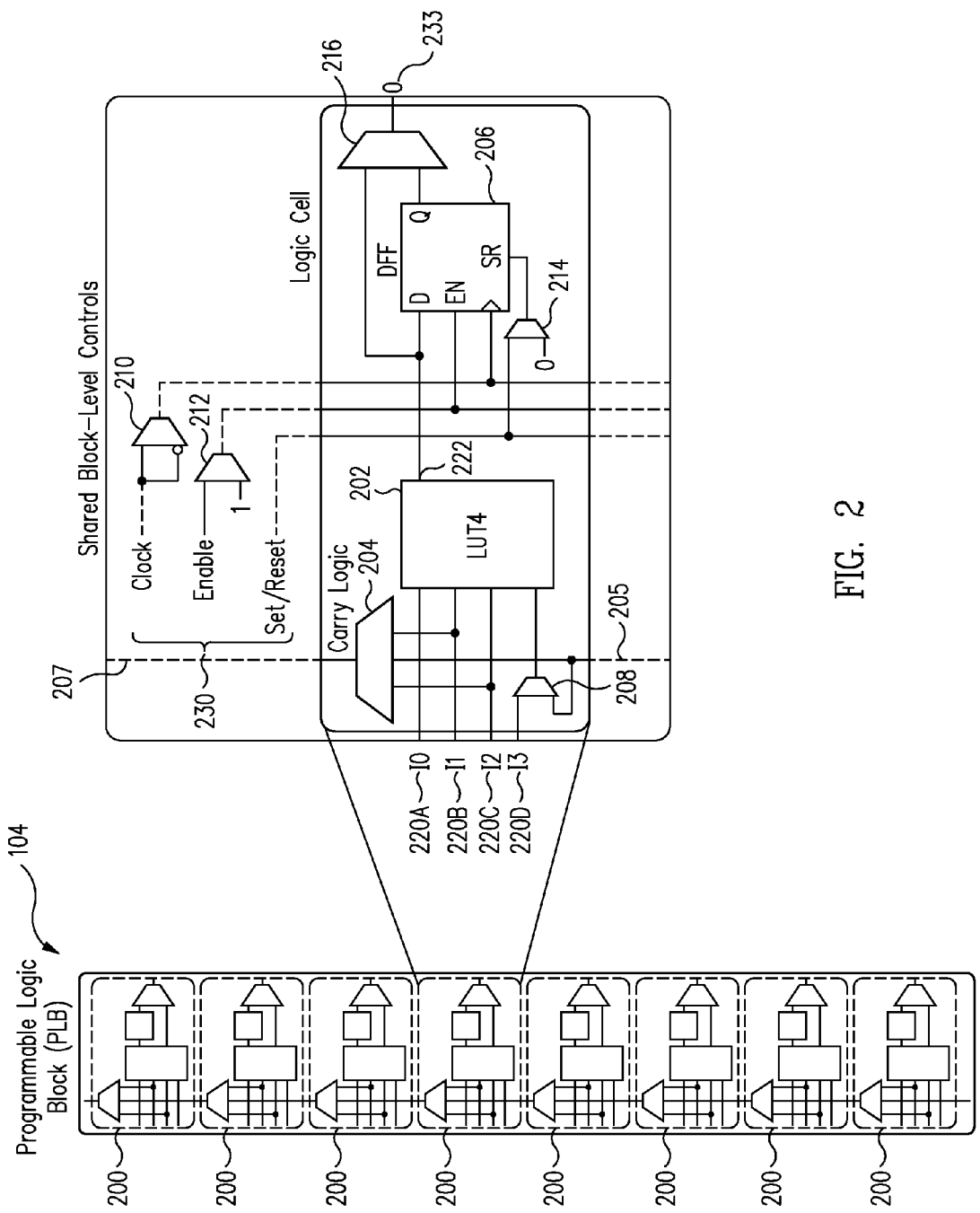
FIG. 2 illustrates a block diagram of a logic block for a PLD in accordance with an embodiment of the disclosure.

FIG. 2 illustrates a block diagram of a logic block 104 of PLD 100 in accordance with an embodiment of the disclosure. As discussed, PLD 100 includes a plurality of logic blocks 104 including various components to provide logic and arithmetic functionality.

In the example embodiment shown in FIG. 2, logic block 104 includes a plurality of logic cells 200. For example, each logic cell 200 may include various components such as: a lookup table (LUT) 202, a carry logic circuit 204, a latch 206 (e.g., register), and programmable multiplexers 208, 212, 214, and 216 for selecting desired signal paths for logic cell 200. In this example, LUT 202 accepts four inputs 220A-220D, which makes it a four-input LUT (which may be abbreviated as "4-LUT" or "LUT4") that can be programmed by configuration data for PLD 100 to implement any appropriate logic operation having four inputs or less. LUT 202 in other examples may be of any other suitable size having any other suitable number of inputs for a particular implementation of a PLD. In some embodiments, different size LUTs may be provided for different logic blocks 104 and/or different logic cells 200.

An output signal 222 from LUT 202 may be passed through multiplexer 216 or register 206 to provide an output signal 233 of logic cell 200. Depending on the configuration of multiplexers 210-216, output signal 222 may be temporarily stored (e.g., latched) in latch 206 according to control signals 230. In some embodiments, configuration data for PLD 100 may configure output 233 of logic cell 200 to be provided as one or more inputs of another logic cell 200 (e.g., in another logic block or the same logic block) in a staged or cascaded arrangement (e.g., comprising multiple levels) to configure logic operations that cannot be implemented in a single logic cell 200 (e.g., logic operations that have too many inputs to be implemented by a single LUT 202).

Carry logic circuit 204 may be utilized for some configurations of PLD 100 to efficiently implement arithmetic operations such as adders, subtractors, comparators, counters, or other operations, or to efficiently form some wide logic operations (e.g., working on multiple bit data). In this regard, carry logic circuits 204 across multiple logic cells 200 may be chained together to pass carry-in signals 205 and carry-out signals 207 between adjacent logic cells 200. In the example of FIG. 2, carry-in signal 205 may be passed to carry logic circuit 204 by configuring programmable multiplexer 208. In some embodiments, carry logic circuits 204 may be chained across multiple logic blocks 200. Carry logic circuit 204 may be implemented to provide a carry value for arithmetic operations or logic operations. For example, in one embodiment, carry logic circuit 204 may be implemented using a carry-multiplexer (also referred to as a "carry-mux").

Logic cell 200 illustrated in FIG. 2 is merely an example, and logic cells 200 according to different embodiments may include different combinations of PLD components. Also, although FIG. 2 illustrates logic block 104 having eight logic cells 200, logic block 104 according to other embodiments may include fewer logic cells 200 or more logic cells 200. Each of the logic cells 200 of logic block 104 may be used to implement a portion of a user design implemented by PLD 100. In this regard, PLD 100 may include many logic blocks 104, each of which may include logic cells 200 and/or other components which are used to collectively implement the user design.

As further described herein, portions of a user design may be adjusted to occupy fewer logic cells 200 and/or fewer logic blocks 104 when PLD 100 is configured to implement the user design. Such adjustments according to various embodiments may identify certain arithmetic or logic operations, such as constant multiplier operations, to be implemented in an arrangement occupying multiple embodiments of logic cells 200 and/or logic blocks 104. As further described herein, an optimization process may rearrange various signal connections associated with the arithmetic/logic operations described herein, such that a constant multiplier operation may be implemented into logic cells 200 and/or logic blocks 104 to be associated with the preceding arithmetic/logic operations.

Figure 3:
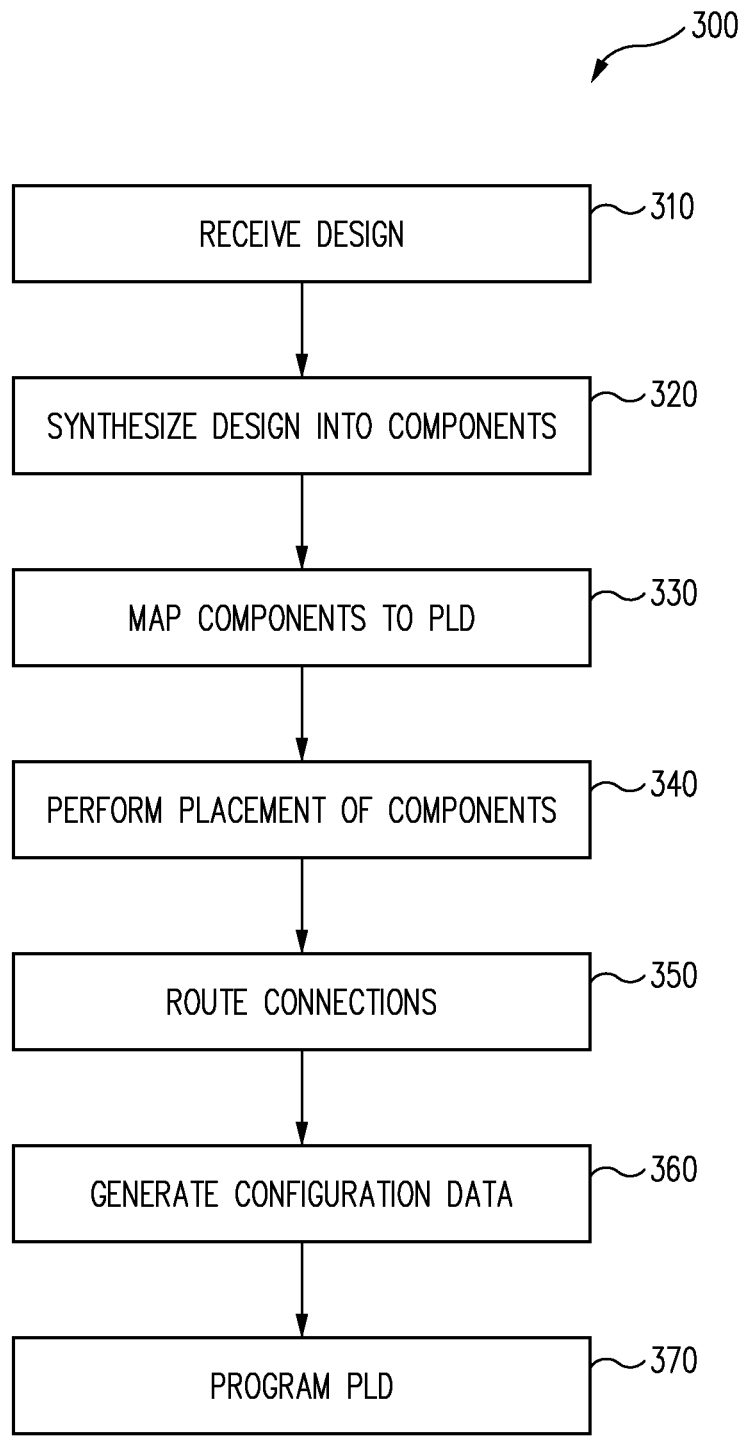
FIG. 3 illustrates a design process for a PLD in accordance with an embodiment of the disclosure.

FIG. 3 illustrates a design process 300 for a PLD in accordance with an embodiment of the disclosure. For example, the process of FIG. 3 may be performed by system 130 running Lattice Diamond software to configure PLD 100. In some embodiments, the various files and information referenced in FIG. 3 may be stored, for example, in one or more databases and/or other data structures in memory 134, machine readable medium 136, and/or otherwise.

In operation 310, system 130 receives a user design that specifies the desired functionality of PLD 100. For example, the user may interact with system 130 (e.g., through user input device 137 and hardware description language (HDL) code representing the design) to identify various features of the user design (e.g., high level logic operations, hardware configurations, and/or other features). In some embodiments, the user design may be provided in a register transfer level (RTL) description (e.g., a gate level description). System 130 may perform one or more rule checks to confirm that the user design describes a valid configuration of PLD 100. For example, system 130 may reject invalid configurations and/or request the user to provide new design information as appropriate.

In operation 320, system 130 synthesizes the design to create a netlist (e.g., a synthesized RTL description) identifying an abstract logic implementation of the user design as a plurality of logic components (e.g., also referred to as netlist components). In some embodiments, the netlist may be stored in Electronic Design Interchange Format (EDIF) in a Native Generic Database (NGD) file.

In some embodiments, synthesizing the design into a netlist in operation 320 may involve converting (e.g., translating) the high-level description of logic operations, hardware configurations, and/or other features in the user design into a set of PLD components (e.g., logic blocks 104, logic cells 200, and other components of PLD 100 configured for logic, arithmetic, or other hardware functions to implement the user design) and their associated interconnections or signals. Depending on embodiments, the converted user design may be represented as a netlist.

In some embodiments, synthesizing the design into a netlist in operation 320 may further involve performing an optimization process on the user design (e.g., the user design converted/translated into a set of PLD components and their associated interconnections or signals) to reduce propagation delays, consumption of PLD resources and interconnections, and/or otherwise optimize the performance of the PLD when configured to implement the user design. Depending on embodiments, the optimization process may be performed on a netlist representing the converted/translated user design. Depending on embodiments, the optimization process may represent the optimized user design in a netlist (e.g., to produce an optimized netlist).

In some embodiments, the optimization process may include optimizing certain instances of a constant multiplier operation which, when a PLD is configured to implement the user design, would occupy a plurality of configurable PLD components (e.g., logic cells 200 and/or logic blocks 104). For example, as further described herein with regard to FIGS. 4 and 5, the optimization process may include detecting constant multiplier operations in the user design and decomposing the identified constant multiplier operations using corresponding nearest boundary conditions for constants of the constant multiplier operations to reduce the number of PLD components used to implement the constant multiplier operations and/or to reduce the propagation delay associated with the constant multiplier operations.

In operation 330, system 130 performs a mapping process that identifies components of PLD 100 that may be used to implement the user design. In this regard, system 130 may map the optimized netlist (e.g., stored in operation 320 as a result of the optimization process) to various types of components provided by PLD 100 (e.g., logic blocks 104, logic cells 200, embedded hardware, and/or other portions of PLD 100) and their associated signals (e.g., in a logical fashion, but without yet specifying placement or routing). In some embodiments, the mapping may be performed on one or more previously-stored NGD files, with the mapping results stored as a physical design file (e.g., also referred to as an NCD file). In some embodiments, the mapping process may be performed as part of the synthesis process in operation 320 to produce a netlist that is mapped to PLD components.

In operation 340, system 130 performs a placement process to assign the mapped netlist components to particular physical components residing at specific physical locations of the PLD 100 (e.g., assigned to particular logic cells 200, logic blocks 104 and/or other physical components of PLD 100), and thus determine a layout for the PLD 100. In some embodiments, the placement may be performed on one or more previously-stored NCD files, with the placement results stored as another physical design file.

In operation 350, system 130 performs a routing process to route connections (e.g., using routing resources 180) among the components of PLD 100 based on the placement layout determined in operation 340 to realize the physical interconnections among the placed components. In some embodiments, the routing may be performed on one or more previously-stored NCD files, with the routing results stored as another physical design file.

Thus, following operation 350, one or more physical design files may be provided which specify the user design after it has been synthesized (e.g., converted and optimized), mapped, placed, and routed for PLD 100 (e.g., by combining the results of the corresponding previous operations). In operation 360, system 130 generates configuration data for the synthesized, mapped, placed, and routed user design. In operation 370, system 130 configures PLD 100 with the configuration data by, for example, loading a configuration data bitstream into PLD 100 over connection 140.

Figure 4:
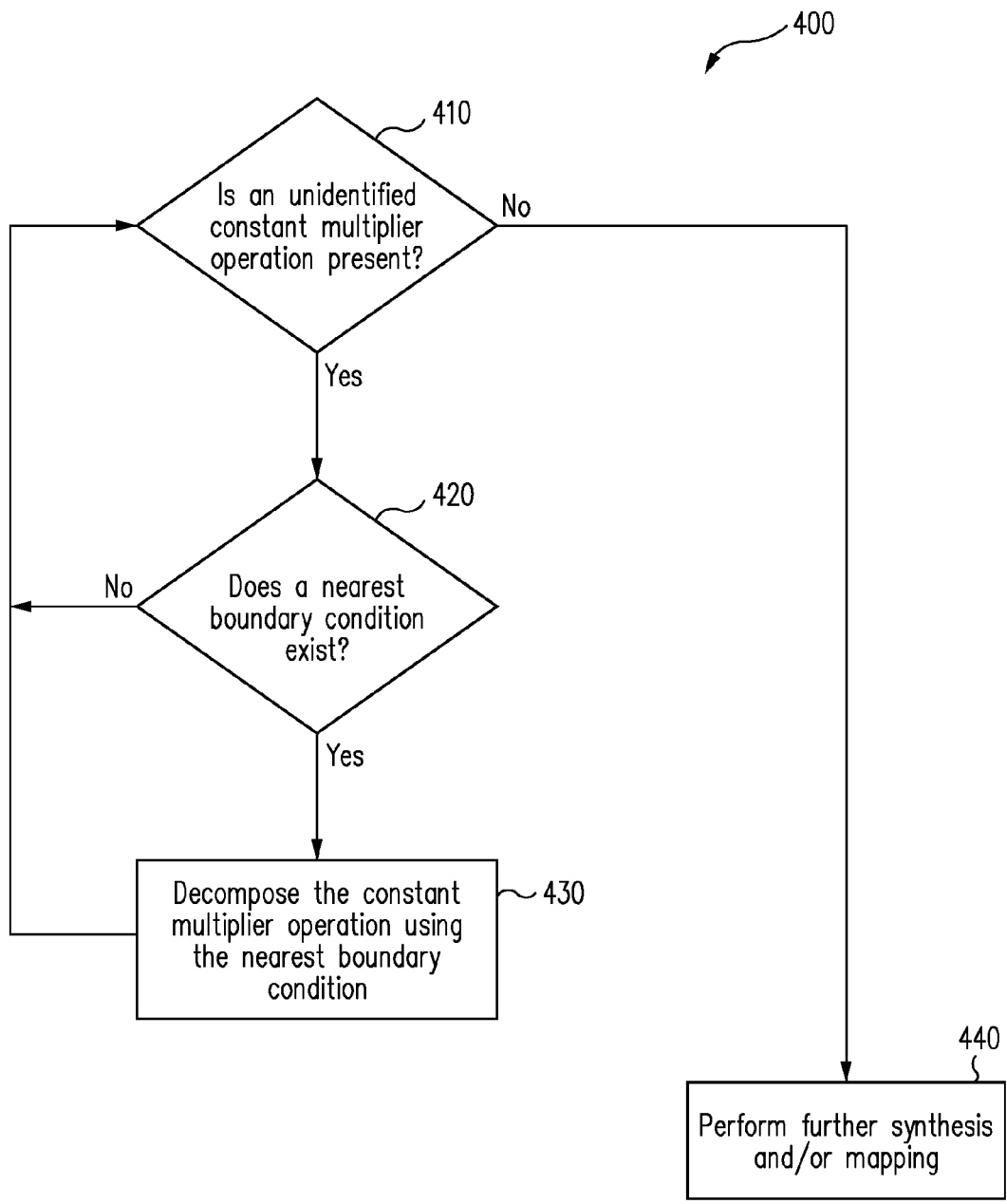
FIG. 4 illustrates a constant multiplier operation synthesis and/or mapping process for a user design and/or PLD in accordance with an embodiment of the disclosure.

FIG. 4 illustrates a constant multiplier operation synthesis and/or mapping process 400 (e.g., also referred to as an optimization process) for a user design and/or PLD, in accordance with an embodiment of the disclosure. In some embodiments, process 400 may be performed during operation 320 of process 300 as discussed above. In other embodiments, process 400 may be performed after generation of a preliminary netlist and/or mapping generated by a preliminary execution of operations 320 and/or 330 of process 300, for example, and may be adapted to be performed on such preliminary netlist and/or mapping specified user design (e.g., using EDIF and/or NGD) rather than or in addition to being performed on an HDL or RTL specified user design. Process 400 may be executed by system 130 to optimize certain instances of constant multiplier operations as discussed above. In particular, one or more embodiments of process 400 may optimize the user design for a PLD with logic blocks or logic cells that comprise four-input LUTs, such as the example of logic block 104 and logic cell 200 having LUT 202 shown in FIG. 2. For example, a single four-input LUT may be configured to implement one bit of a multi-bit addition or subtraction operation.

Figure 5:
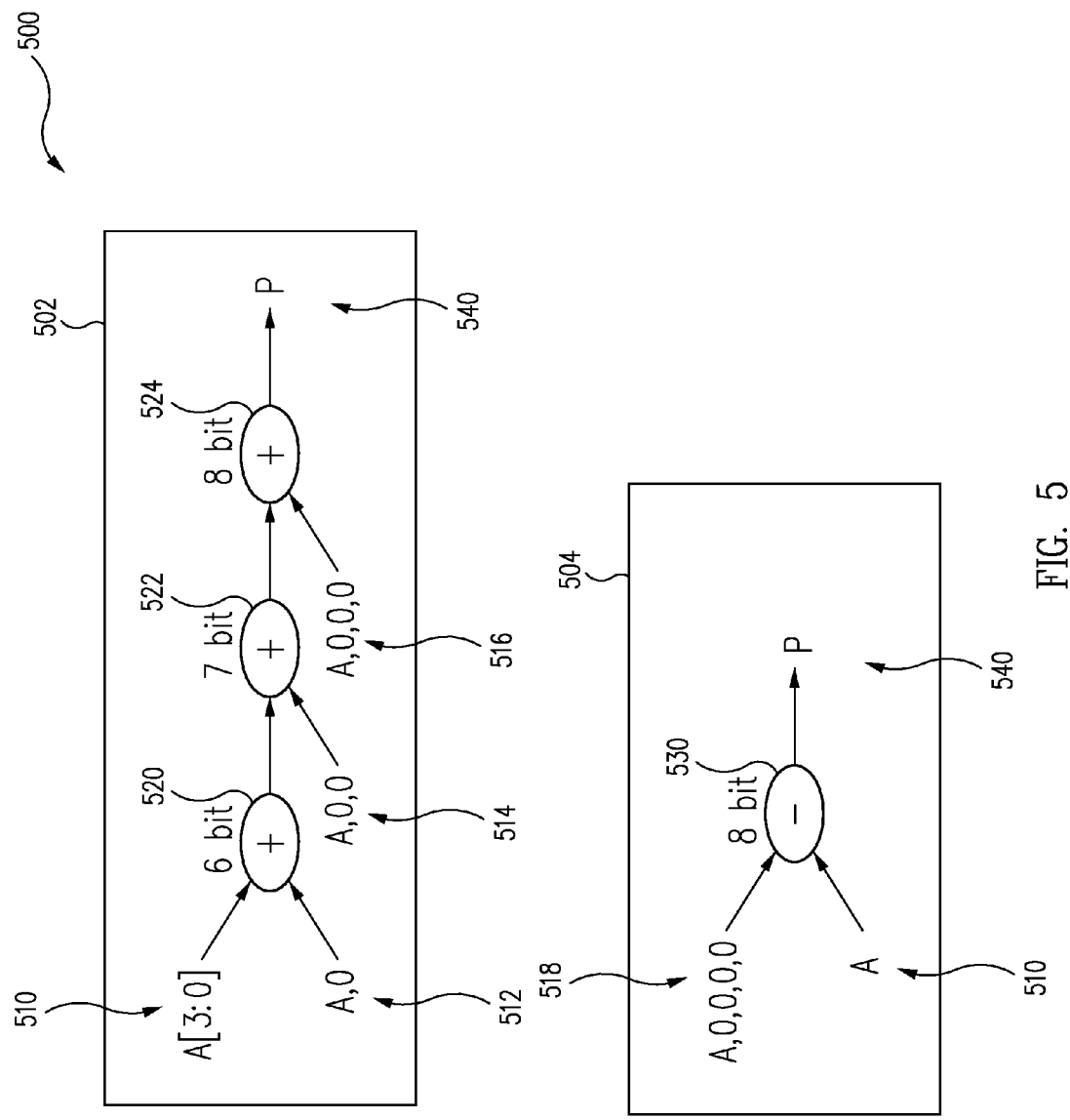
FIG. 5 illustrates a comparison of a relatively inefficient decomposition of a binary constant multiplier operation to a relatively efficient decomposition of the binary constant multiplier operation, in accordance with an embodiment of the disclosure.

In various embodiments, process 400 may identify, from the user design, certain instances of constant multiplier operations that can be optimized through systematic decomposition, as described herein. FIG. 5 illustrates two different decompositions of the constant multiplier operation $A[3:0]*\{1111\}=P$, including a relatively inefficient decomposition 502 and a relatively efficient decomposition 504, in accordance with an embodiment of the disclosure.

In FIG. 5, decomposition 502 takes in variable data A 510 having a multi-bit width (4-bit-wide variable data shown and labeled by its bit range "[3:0]" in this example) and produces product P 540. As shown, decomposition 502 includes three shifted versions of variable data A including one-bit shifted version 512, two-bit shifted version 514, and three-bit shifted version 516, and three stages or layers of addition operations including six-bit addition operation 520, seven-bit addition operation 522, and eight-bit addition operation 524. In some embodiments, each bit of each addition operation may be implemented with a single four-input LUT, and so decomposition 502 may be implemented with a total of twenty one four-input LUTs arranged in three levels as shown.

In the embodiment shown in FIG. 5, decomposition 504 corresponds to a decomposition derived from a "ceiling" binary boundary condition (e.g., a ceiling power of two of $2^4=16$). Decomposition 504 takes in the same variable data A 510 and produces the same product P 540. However, decomposition 504, which corresponds to a nearest binary boundary condition, includes only one four-bit shifted version 518 of variable data A and a single eight-bit addition operation 530, and so decomposition 504 may be implemented with a total of eight four-input LUTs arranged in a single level as shown.

Thus, in embodiments similar to that shown in FIG. 2, where each logic cell 200 includes a single four-input LUT 202, the area savings is approximately 60% (e.g., the reduction in the number of logic cells used) and the timing improvement is approximately 66% (the reduction from three states or levels to a single level). Using similar analysis where the constant is {1110}, which equates to replacing addition operation 520 in decomposition 502 with shifted version 512, and replacing variable data A 510 in decomposition 504 with shifted version 512, decomposition 502 would require fifteen LUTs and two stages, and decomposition 504 would require eight LUTs and one stage, and the resulting area savings and timing improvements would be 47% and 50%, respectively.

As further described herein, process 400 may advantageously determine one or more decompositions of constant multiplier operations detected in a user design (e.g., decompositions 502 and 504 of FIG. 5), and decompose the constant multiplier operations according to a nearest boundary condition (e.g., corresponding to decomposition 504 of FIG. 5), thereby reducing the number of PLD resources that would otherwise be consumed to implement, for example, decomposition 502.

Referring again to FIG. 4, in operation 410, system 130 determines whether an unidentified constant multiplier operation is present in the user design. If so, process 400 tags the unidentified constant multiplier operation as identified and continues to operation 420 to check if a nearest boundary condition exists. If not, process 400 continues to operation 440 to perform further synthesis, mapping, and/or other optimizations if desired or available with respect to the user design.

In operation 420, system 130 determines whether a nearest boundary condition exists for the constant multiplier operation identified in operation 410. If so, process 400 continues to operation 430 to decompose the constant multiplier operation using the nearest boundary condition, as described herein, after which process 400 may loop back to operation 410. Otherwise, process 400 loops back to operation 410, as shown.

In some embodiments, system 130 may be configured to determine whether a nearest boundary condition exists for a constant multiplier operation by mathematically comparing the constant of the constant multiplier operation to the closest ceiling boundary condition and the closest floor boundary condition (e.g., by comparing the differences between the constant and either boundary condition). If one difference is less than the other, then the boundary condition corresponding to the smaller difference is the nearest boundary condition. In a specific embodiment, where the constant multiplier operation is a binary operation, system 130 may be configured to compare the binary representation of the constant to the binary representations of the floor and ceiling decompositions of the constant, and totaling the number of "1" digits in each. If the number of "1" digits in one decomposition is less than in the other, then the boundary condition corresponding to the fewer "1" digits is the nearest boundary condition.

For example, where the constant is {1111} (e.g., 15), the number of "1" digits is 4. The ceiling and floor boundary conditions are {10000} and {1000} respectively (e.g., 16 and 8), and the corresponding decompositions of the constant are ({10000}−{1}) (e.g., number of "1" digits is 2) and ({1000}+{100}+{10}+{1}) (e.g., number of "1" digits is 4). Thus, the ceiling boundary condition is the nearest binary boundary condition. In another example, where the constant is {1100}, it can be shown that the corresponding decompositions are ({10000}−{10}) and ({1000}+{100}) (e.g., the number of "1" digits for both is 2), and thus there is no single nearest boundary condition. In some embodiments, such a determination method may be used to optimize the synthesizing and/or mapping processing of system 130, as described herein.

It should be appreciated that operations 410 and 420 may be performed in any appropriate order to identify suitable instances in the user design to optimize. For example, in some cases, it may be more efficient to identify all constant multiplier operations present in the user design before moving to operation 420. In such cases, system 130 may first determine whether the same constant is used in multiple multiplier operations to minimize the number of times operations 420 and/or 430 are performed (e.g., once per unique constant). Decompositions for constant multiplier operations with unique constants may be copied for use in constant multiplier operations with non-unique constants.

Once a suitable instance of a constant multiplier operation with a corresponding nearest boundary condition is determined to be present and identified through operations 410-420, an optimization may be performed on the identified instance by decomposing the constant multiplier operation using the nearest boundary condition, in operation 430, as described herein.

For example, in one embodiment, the nearest boundary condition may be used to decompose the constant of the constant multiplier operation into a shift operation corresponding to the nearest boundary condition and one or more addition and/or subtraction operations to compensate for the difference between the nearest boundary condition and the constant. Where the nearest boundary condition is a ceiling boundary condition (e.g., is greater than the constant), the one or more addition and/or subtraction operations may include at least one subtraction operation. Similarly, where the nearest boundary condition is a floor boundary condition (e.g., is smaller than the constant), the one or more addition and/or subtraction operations may include at least one addition operation. In various embodiments, each addition and/or subtraction operation may be implemented using at least one LUT. In particular, each bit of each addition or subtraction operation may be implemented using a single four-input LUT. More generally, the methods described herein are applicable to multi-bit constant multiplier operations.

After optimizing a suitable instance of a constant multiplier operation in operation 430, process 400 may loop through operations 410-430 until all such constant multiplier operations in the user design are similarly optimized or at least identified, and then continue (e.g., through the "no" option of operation 410) to operation 440 to perform further synthesis, mapping, and/or other optimizations if desired or available with respect to the user design. For example, in one embodiment, constant multiplier operations lacking a nearest boundary condition may be decomposed using one of two equidistant boundary conditions and/or other arithmetic and/or logical decompositions in order to be implemented in a PLD.

Therefore, in view of the present disclosure, it will be appreciated that the optimization techniques described herein may be used to identify and optimize various instances of constant multiplier operations. Without applying the optimization techniques of the present disclosure, such instances in the user design would unnecessarily occupy multiple configurable PLD components and/or levels of configurable PLD components when a PLD is configured to implement the user design. As discussed above, the optimization techniques may decompose constant multiplier operations with corresponding nearest boundary conditions, such that resulting synthesis and/or mapping can reduce the levels of configurable PLD components used to implement the user design. Such an optimization may beneficially reduce consumption of configurable PLD resources, and in some cases may permit an increase in the clock frequency of a PLD configured with the user design for an increase computational performance. In general statistical analysis of a typical user design comprising a variety of arithmetic and logical operations, the utilization of PLD components can be reduced by approximately 13% or more.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

We claim:

1. A computer-implemented method comprising:
   receiving a design identifying operations to be performed by a programmable logic device (PLD); and
   synthesizing the design into a plurality of PLD components, wherein the synthesizing comprises:
   detecting a constant multiplier operation in the design,
   determining a nearest boundary condition for the constant multiplier operation, and
   decomposing the constant multiplier operation using the nearest boundary condition to reduce the plurality of PLD components, wherein the reduced plurality of PLD components comprise at least one look up table (LUT) configured to implement an addition or subtraction operation of the decomposed constant multiplier operation.

2. The computer-implemented method of claim 1, wherein the nearest boundary condition comprises a nearest binary boundary condition, and wherein the synthesizing comprises:
   determining a nearest power of two for a constant of the constant multiplier operation; and
   decomposing the constant multiplier operation into a shift operation corresponding to the nearest power of two and one or more addition and/or subtraction operations; and
   implementing the one or more addition and/or subtraction operations by the at least one LUT.

3. The computer-implemented method of claim 2, wherein:
   the nearest power of two comprises a ceiling nearest power of two; and
   the at least one LUT is configured to implement at least one subtraction operation.

4. The computer-implemented method of claim 2, wherein:
   the nearest power of two comprises a floor nearest power of two; and
   the at least one LUT is configured to implement at least one addition operation.

5. The computer-implemented method of claim 1, wherein the synthesizing comprises:
   detecting a plurality of constant multiplier operations in the design;
   determining nearest boundary conditions for constant multiplier operations with unique constants; and
   decomposing each of the constant multiplier operations with unique constants into a shift operation and one or more addition and/or subtraction operations; and
   implementing the one or more addition and/or subtraction operations by the at least one LUT.

6. The computer-implemented method of claim 1, wherein the synthesizing comprises:
   detecting a plurality of constant multiplier operations in the design;
   determining at least one of the plurality of constant multiplier operations lacks a corresponding nearest boundary condition; and
   decomposing each of the constant multiplier operations with nearest boundary conditions into a shift operation and one or more addition and/or subtraction operations; and
   implementing the one or more addition and/or subtraction operations by the at least one LUT.

7. The computer-implemented method of claim 1, wherein the constant multiplier operation comprises a multi-bit constant multiplier operation.

8. The computer-implemented method of claim 1, wherein:
the at least one LUT is implemented within a programmable logic block of the PLD;
the programmable logic block comprises a plurality of logic cells; and
each one of the at least one LUT is associated with a corresponding one of the logic cells.

9. The computer-implemented method of claim 1, wherein:
each one of the at least one LUT is a four-input LUT; and
the four-input LUT is configured to implement a one bit addition or subtraction operation.

10. The computer-implemented method of claim 1, further comprising:
generating configuration data to configure physical components of the PLD in accordance with the synthesized design; and
programming the PLD with the configuration data.

11. A system comprising:
a processor; and
a memory adapted to store a plurality of computer readable instructions which when executed by the processor are adapted to cause the system to perform a computer-implemented method comprising:
receiving a design identifying operations to be performed by a programmable logic device (PLD),
synthesizing the design into a plurality of PLD components, wherein the synthesizing comprises:
detecting a constant multiplier operation in the design,
determining a nearest boundary condition for the constant multiplier operation, and
decomposing the constant multiplier operation using the nearest boundary condition to reduce the plurality of PLD components.

12. The system of claim 11, wherein the synthesizing comprises:
determining the nearest boundary condition for the constant of the constant multiplier operation; and
decomposing the constant multiplier operation into a shift operation corresponding to the nearest boundary condition and one or more addition and/or subtraction operations; and
implementing the one or more addition and/or subtraction operations by at least one look up table (LUT) of the reduced plurality of PLD components.

13. The system of claim 12, wherein:
the nearest boundary condition comprises a ceiling nearest boundary condition; and
the at least one LUT is configured to implement at least one subtraction operation.

14. The system of claim 12, wherein:
the nearest boundary condition comprises a floor nearest boundary condition; and
the at least one LUT is configured to implement at least one addition operation.

15. The system of claim 11, wherein the synthesizing comprises:

detecting a plurality of constant multiplier operations in the design;
determining nearest boundary conditions for constant multiplier operations with unique constants; and
decomposing each of the constant multiplier operations with unique constants into a shift operation and one or more addition and/or subtraction operations; and
implementing the one or more addition and/or subtraction operations by at least one look up table (LUT) of the reduced plurality of PLD components.

16. The system of claim 11, wherein the synthesizing comprises:
detecting a plurality of constant multiplier operations in the design;
determining at least one of the plurality of constant multiplier operations lacks a corresponding nearest binary boundary condition; and
decomposing each constant multiplier operation with a nearest boundary condition into a shift operation and one or more addition and/or subtraction operations; and
implementing the one or more addition and/or subtraction operations by at least one look up table (LUT) of the reduced plurality of PLD components.

17. The system of claim 11, wherein the constant multiplier operation comprises a multi-bit constant multiplier operation.

18. The system of claim 11, wherein:
the reduced plurality of PLD components comprise at least one look up table (LUT) configured to implement an addition or subtraction operation of the decomposed constant multiplier operation;
the at least one LUT is implemented within a programmable logic block of the PLD;
the programmable logic block comprises a plurality of logic cells;
each one of the at least one LUT is a four-input LUT associated with a corresponding one of the logic cells; and
the four-input LUT is configured to implement a one bit addition or subtraction operation.

19. The system of claim 11, wherein the computer-implemented method further comprises:
generating configuration data to configure physical components of the PLD in accordance with the synthesized design; and
programming the PLD with the configuration data.

20. A non-transitory machine-readable medium storing a plurality of machine-readable instructions which when executed by one or more processors of a computer system are adapted to cause the computer system to perform a computer-implemented method comprising:
receiving a design identifying operations to be performed by a programmable logic device (PLD);
synthesizing the design into a plurality of PLD components, wherein the synthesizing comprises:
detecting a constant multiplier operation in the design,
determining a nearest boundary condition for the constant multiplier operation and
decomposing the constant multiplier operation using the nearest boundary condition to reduce the plurality of PLD components.

* * * * *